United States Patent
Gandi et al.

(10) Patent No.: US 6,514,616 B1
(45) Date of Patent: Feb. 4, 2003

(54) THERMAL MANAGEMENT DEVICE AND METHOD OF MAKING SUCH A DEVICE

(75) Inventors: Angelo Gandi, Geneva (CH); Rui De Oliveira, Geneva (CH); Anthony Arthur Carter, London (GB)

(73) Assignee: Queen Mary and Westfield College, University of London, London (GB)

(*) Notice: Subject to any disclaimer, the term of this patent is extended or adjusted under 35 U.S.C. 154(b) by 0 days.

(21) Appl. No.: 09/719,478

(22) PCT Filed: Jul. 8, 1999

(86) PCT No.: PCT/GB99/02180

§ 371 (c)(1),
(2), (4) Date: Mar. 5, 2001

(87) PCT Pub. No.: WO00/03567

PCT Pub. Date: Jan. 20, 2000

(30) Foreign Application Priority Data

| Jul. 8, 1998 | (GB) | 9814835 |
| Nov. 19, 1998 | (GB) | 9825376 |
| Jan. 15, 1999 | (GB) | 9900924 |

(51) Int. Cl.[7] ................................................. B32B 9/00
(52) U.S. Cl. ....................... 428/408; 408/594; 408/901; 361/679; 361/704; 361/705
(58) Field of Search ................................. 428/408, 901, 428/594; 361/704, 705, 679

(56) References Cited

U.S. PATENT DOCUMENTS

| 4,318,954 A | 3/1982 | Jensen |
| 4,591,659 A | 5/1986 | Liebowitz |
| 4,791,248 A | 12/1988 | Oldenettel |
| 4,849,858 A | 7/1989 | Grapes et al. |
| 4,916,016 A | 4/1990 | Bristowe et al. |
| 5,296,310 A | 3/1994 | Kibler et al. |
| 5,309,321 A | 5/1994 | Olla et al. |
| 5,750,058 A | 5/1998 | Hecht et al. |
| 6,075,701 A | 6/2000 | Ali et al. |

FOREIGN PATENT DOCUMENTS

| DE | 43 05 399 A1 | 9/1993 |
| EP | 0 147 014 A2 | 7/1985 |
| FR | 2 546 878 | 12/1984 |
| WO | 96/37915 | 11/1996 |

OTHER PUBLICATIONS

Malamas, J. et al., "Properties of Graphite Interconnect Circuit Boards with Anisotropic Thermal Expansion", *Mat. Res. Soc. Symp. Proc.*, vol. 21, 1991, pp. 385–390.

*Primary Examiner*—Deborah Jones
*Assistant Examiner*—Abraham Bahta
(74) *Attorney, Agent, or Firm*—Dicke, Billig & Czaja, P.A.

(57) ABSTRACT

A thermal management device includes an isotropic carbon encapsulated in an encapsulating material that improves the strength of the carbon. The encapsulating material may be e.g. polyimide, epoxy resin, acrylic, polyurethane, polyester, or any other suitable polymer.

69 Claims, 5 Drawing Sheets

THERMAL MANAGEMENT DEVICE AND METHOD OF MAKING SUCH A DEVICE

This application is a U.S. National-Stage entry under 35 U.S.C. §371 based on International Application No. PCT/GB99/02180, filed Jul. 8, 1999, which was published under PCT Article 21 (2) in English; this application also claims priority under 35 U.S.C. §119 to British Applications Nos. GB 9814835.6, filed Jul. 8, 1998, GB 9825376.8, filed Nov. 19, 1998 and GB 9900924.3, filed Jan. 15, 1999.

The present invention relates to a thermal management device for managing the dissipation of heat in, for example, electronic equipment and a method of making such a device. In particular, the invention relates to a thermal management device that has electrical feed through capability and can act as a direct interface to active elements.

Electronic and electrical devices are the sources of both power and heat. As is well known, in order to provide reliable operation of such devices, it is necessary to maintain stable operating conditions and temperatures. Hence, efficient methods for heat management and dissipation are essential. Typically this is done by providing thermal management devices that are arranged adjacent and in contact with the electronic device or circuit board. Heat generated in the circuit is transferred to and dissipated in the thermal management device. For optimum efficiency, it is desirable that thermal management structures have the highest possible thermal conductivity, efficient external connectivity and appropriate mechanical strength.

To achieve these objectives in thermally demanding applications, some known devices encapsulate high thermal conductivity materials into composite structures. However, these devices often achieve only limited performance, with significant conductivity losses, typically 40%, and increases in mass and bulk Examples of such structures are described in EP 0,147,014, EP 0,428,458, U.S. Pat. No. 5,296,310, U.S. Pat. No. 4,791,248 and EP 0,231.823. The best thermal management systems available at present have conductivities that typically do not exceed 1,000 W/mK.

Current technologies do not provide thermal management that is sufficient in many applications whilst at the same time providing efficient electrical interconnection between layers or sides of circuit boards. A further problem is that the mass and volume of known thermal management systems are relatively large. This affects the overall size of electronic systems in which such devices are incorporated. In this day and age when the general drive of the electronics industry is towards miniaturisation, this is highly disadvantageous.

Thermal management systems are often used as substrates for supports for hybrid electronic circuits. In one known arrangement, beryllia is used as a heat sink. This has a thermal conductivity of around 280 W/mK at room temperature. On top of this is a layer of dielectric on which gold contacts are subsequently formed, thereby to enable connection to other electrical circuits. A disadvantage of this arrangement is that beryllia is a hazardous material, in fact it is carcinogenic, and is generally difficult to process. In addition, the dielectric tends to be thick thereby making the overall structure bulky. Furthermore, partly because of the use of gold as a contact material, the overall structure is expensive to manufacture.

An object of the present invention is to provide a thermal management system that has a high thermal conductivity but a low mass and volume.

According to a first aspect of the present invention there is provided a thermal management device comprising anisotropic carbon encapsulated in an encapsulating material that is applied directly to the carbon and is able to improve the rigidity of the carbon, preferably wherein the encapsulating material is polyimide or epoxy resin or acrylic or polyurethane or polyester or any other suitable polymer.

Preferably, the anisotropic carbon has mosaic or full ordering.

Preferably, the anisotropic carbon is thermalised pyrolytic graphite that has mosaic or full ordering. The thermalised pyrolytic graphite may have an in plane thermal conductivity of 1550–1850 W/mK at around room temperature. Typically, the thermalised pyrolitic graphite has a low value of tensile strength in the orthogonal direction.

The anisotropic carbon may alternatively be pyrolytic graphite. The pyrolytic graphite may be in an "as deposited" or partially ordered form. The conductivity of the pyrolytic graphite may be in the range of 300–420 W/mK in one plane. The tensile strength of the plate may be 1.5 Ksi in the orthogonal plane.

Preferably, the anisotropic carbon is a plate. Preferably the carbon plate has a thickness in the range 100–500 $\mu$m. The carbon plate may have a thickness in the range of 200–250 $\mu$m or 250–300 $\mu$m or 300–350 $\mu$m or 350–400 $\mu$m or 400–450 $\mu$m or 450–500 $\mu$m.

Preferably the material encapsulating the carbon has a low thermal expansion coefficient and high degradation temperature, such as a polyimide, for example PI 2734 provided by DuPont (trade mark), where the thermal expansion coefficient is around 13 ppm/C and the degradation temperature is around 500 C.

The coating layer may have a thickness in the range from a few microns to many tens of microns. Multiple layers of coating may be formed on the carbon in order to build up a desired thickness.

A matrix of fine holes, preferably 200 $\mu$m diameter. may be formed through the carbon plate, prior to encapsulation. These holes are filled during encapsulation of the plate. An advantage of this is that it reduces the possibility of internal delamination.

According to a second aspect. of the present invention. there is provided an electrical system comprising a thermal management device in which the first aspect of the invention is embodied, on a surface of which electrical contacts and/or devices are provided.

The devices may be deposited directly on the surface or may be glued using, for example, a thin layer of liquid glue. Preferably, the devices are encapsulated in polyimide or epoxy resin or acrylic or polyurethane or polyester or any other suitable polymer.

Preferably, a plurality of layers of electrical components are provided, each spaced apart by layers of polyimide. Typically, the electrical contacts are made of thin film metal, for example aluminium.

According to a third aspect of the present invention there is provided a method of fabricating a thermal management device comprising:
  applying a coat of encapsulating material, preferably polyimide or epoxy
  resin or acrylic or polyurethane or polyester or any other suitable
  polymer directly to a clean carbon surface, the encapsulating material
  being such as to improve the rigidity of the carbon; and
  repeating the foregoing steps until the carbon is encapsulated.

The method may additionally involve curing the encapsulating material.

Preferably, the step of applying involves brushing, rolling, dipping, spraying, spinning, stamping or screen-printing. Preferably, for polyimide, which consists of a single-component, the step of applying the coating involves brushing the polyimide or applying it using a roller. For solid phase application a cast can be used. This requires a pre-polymerised foil of the encapsulating material to be applied directly on to the clean surface. This can be useful when simple thermal management devices are required with no internal holes. Preferably, the carbon and cast are compressed within a vacuum and at high temperature.

Preferably, the step of applying involves applying multiple layers of encapsulating material, such as polyimide or epoxy resin or acrylic or polyurethane or polyester or any other suitable polymer, until a desired thickness is reached.

Preferably, the method includes cleaning a surface of the carbon thereby to produce said clean carbon surface.

Preferably, the step of cleaning involves using pumice powder under water to remove loose materials, followed by drying. Preferably, the step of drying involves drying the carbon by baking the carbon surface to remove moisture, for example, at 100 C for one hour.

Preferably the step of cleaning includes degreasing the carbon by, for example, rinsing it with acetone.

When polyimide is used, it is preferable that the step of curing involves heating the carbon to 150 C for, for example, 1 hour and subsequently temperature cycling the board to 150 C for 30 minutes, 250 C for 30 minutes and finally 300 C for 30 minutes.

In the case of epoxy, this can consist of a single component or else be a double component mixture. For the single component type then a two stage gluing can be carried out by firstly drying the glue to remove the solvent at a given temperature, (typically around 120 C.) and form a solid phase, and then heating it at a higher temperature typically around 180° to complete the polymerisation. In the case of double component epoxy, the initial mixing of the components causes the polymerisation process to begin, and the process may then need anything between minutes and several hours for the process to be completed, depending upon the particular epoxy.

Preferably the method further comprises drilling the carbon with at least one hole prior to application of the encapsulating material. The at least one hole may be completely infilled with encapsulating material. The holes may be infilled with encapsulating material that is mixed with glass fibre spheres, each sphere typically having a diameter of 30 $\mu$m. This process may be carried out before the pure polyimide coating is used to encapsulate the surface of the plate, and can improve the uniformity of coating thickness across the surface of the plate by preventing the possibility of thinning occurring around the edges of the initial holes in the plates. In either case, once the encapsulation process is completed, the said at least one hole is re-drilled. thereby to provide a through hole that is electrically insulated from the carbon core.

Preferably, a layer of a conducting material is applied to the at least one hole to produce electrical connections, thereby to enable electrical connections through the carbon. Preferably, the conducting material is a metal, for example thin film aluminium. Alternatively, the edges that define the at least one hole may be coated with the encapsulating material in such a way as to maintain a passage through the carbon, thereby to avoid having to conduct the step of drilling through encapsulating material.

The method may further involve forming a matrix of fine holes through the carbon. These holes are of course infilled when the plate is filly encapsulated.

According to a fourth aspect of the present invention, there is provided a method of fabricating an electrical component comprising the method of the third aspect of the present invention and additionally the steps of forming electrical contacts on at least one surface of the carbon and/or depositing electrical devices thereon.

The step of depositing may involve fabricating the devices directly on the surface or forming the devices or a thin film multi-layer circuit containing the devices separately from the carbon surface and fixing them to that surface. Preferably, the step of fixing involves applying glue to the devices or the circuit or the carbon surface and pressing the devices or circuit and the surface together at room temperature and at low vacuum.

Preferably, the electrical contacts are applied using thin film processing techniques using, for example, aluminium.

Various devices and methods in which the present invention is embodied will now be described by way of example only and with reference to the following drawings, of which:

BRIEF DESCRIPTION OF THE DRAWINGS

FIG. 1 shows a carbon plate 10. This is typically thermalised pyrolytic graphite with mosaic or full ordering, with an in plane thermal conductivity (indicated by arrow A) of 1550–1850 W/mK and a thermal conductivity of 8–25 W/mK in the orthogonal direction (indicated by arrow B), with both directions having low values of tensile strength. This material is friable, breaks easily and so is generally difficult to handle. In addition, due to its inherent softness and layered nature any contact with this material results in small traces of it being transferred to the surface it touched. This is disadvantageous in electrical circuits where any stray shards or pieces of conducting material can result in electrical shorts being formed.

Figure 1:
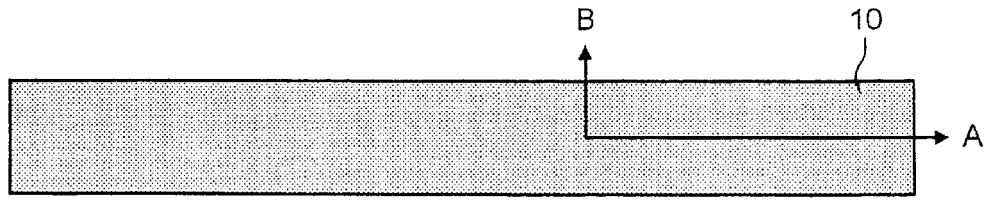
FIG. 1 is a cross-section through a carbon plate.

The plate 10 may alternatively be pyrolytic graphite in an "as deposited" or partially ordered form. This material is anisotropic and typically has a thermal conductivity in the region of 300–420 W/mK in one plane (indicated generally by arrow A in FIG. 1) and 3 W/mK in the orthogonal direction (indicated by arrow B in FIG. 1) with respective tensile strengths of 14 Ksi and 1.5 Ksi.

The plate 10 may have a thickness in the range 100–500 μm, preferably 200 μm. although could have any thickness suitable for a given application.

In order to form a thermal management board that has a high thermal conductivity and is sufficiently mechanically rigid to enable electrical components to be mounted thereon, the plate 10 is directly coated with an encapsulating material. Suitable encapsulating materials include polyimide or epoxy resin or acrylic or polyurethane or polyester 12 or any other such polymer that can be applied directly to the carbon surface and is able to improve the rigidity of the plate without reducing significantly its thermal conductivity. One example of a suitable polyimide is PI 2734, provided by DuPont (trade mark).

Prior to coating, a matrix of fine holes may be formed through the plate (not shown). The diameter of the holes is typically 200 μm. This has the advantage of reducing the possibility of internal delamination.

Figure 2:
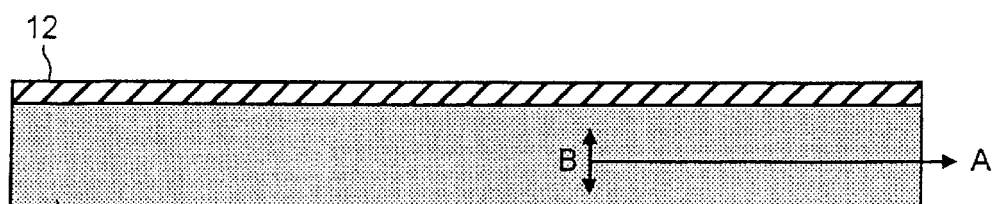
FIG. 2 is a cross-section through a plate that has been partially coated with an encapsulating material, such as polyimide or epoxy resin or acrylic or polyurethane or polyester or any other suitable polymer.

In order to carry out the encapsulating process, the surface of the plate 10, is firstly brushed under water with pumice powder, thereby to remove any loose material. The plate 10 is dried for one hour at 100° C. and decreased with, for example, acetone. A coat of one of the encapsulating materials, for example, PI 2734 approximately 8 μm thick is then applied to one surface of the plate using a brush and the plate 10 is heated for about one hour at 150° C. to partially polymerize the polyimide. This results in one side of the plate being coated with the polyimide 12, as shown in FIG. 2.

Figure 3:
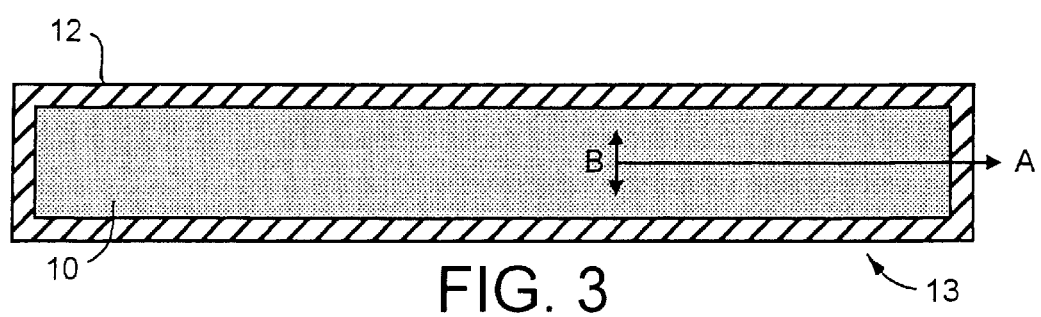
FIG. 3 is a cross-section through a plate that has been fully encapsulated with the encapsulating material.

The foregoing steps are then repeated on each side of the plate 10 until it is fully encapsulated and the desired thickness of the polyimide is reached, as shown in FIG. 3, thereby forming a thermal management board 13. Generally, these steps are carried out on alternate surfaces so that the flatness of the board can be preserved. It is important at this stage to ensure that all sides and edges of the plate are covered. If, however, it is necessary to contact the graphite for some reason, small holes may be left in the polyimide, although these would be in-filled when the appropriate contact is made. Finally, the board 13 is thermally cycled so that it is cured. The thermal cycling for a carbon plate encapsulated by PI 2734 typically involves heating the board 13 to 150° C. for 30 minutes, 200° C. for 30 minutes, 250° C. for 30 minutes and 300° C. for 30 minutes. If a high level of flatness is required, then during the curing stage, the board surfaces are compressed within a press at low vacuum.

The encapsulation process is adapted to suit the specification and geometrical form of the required thermal management structure. For example, if the geometric form of the substrate includes internal holes and/or a complex perimeter with the need for all surfaces and edges to be coated uniformly it is preferred to apply the encapsulating material to the cleaned carbon surfaces using a brush or a roller. This allows all surfaces and edges to be coated as required. Alternatively, the substrate could be coated using techniques such as dipping, spinning, spraying, stamping or screen printing. The drying, heating and optional low vacuum pressing steps are then carried out in the same manner and sequence as previously described.

The processing steps for all the encapsulating materials are essentially the same, but as will be appreciated the temperatures used to cause partial polymerization and curing vary. For example in the case of epoxy resin, if type G10 FR4 is used once the carbon is completely encapsulated it is heated typically to 180 C for about one hour to cure the resin and thereby form the thermal management board. If required, further epoxy layers can be added by repeating the steps of applying the resin and heating the board to form an encapsulation layer of the required thickness.

According Lo another encapsulation technique that uses epoxy resin, for example STYCAST (type 1266) which is a two component epoxy resin, all the resin processing steps can be carried out at room temperature. This minimises the possibilities of generating internal stresses or internal delamination of the substrate. The preparations of the substrate surfaces prior to encapsulation are carried out as previously described. The technique for applying the epoxy resin to the surface of the substrate, using for example screen printing or a brush or roller, is again determined by the same considerations of substrate geometry and form.

In the case of the room temperature processing, where curing times can be between minutes and several hours, depending upon the properties of the particular epoxy resin, the encapsulation process typically has a sequence of curing procedures. An initial low vacuum environment encourages degassing to produce a bubble-free coating. This is followed by the combined application to the board of both a low vacuum and high surface pressure. In this way, a high level of mechanical flatness can be provided for the encapsulated thermal management structure.

The process of encapsulating the plate 10 in any one of the described encapsulation materials maintains the thermal conductivity of the plate at substantially its pre-coating level. For example, when Thermalised pyrolytic graphite is used, the resulting thermal management board has an in-plane thermal conductivity of typically 1700 W/mK at room temperature. It will be appreciated that for lower temperatures the conductivity is likely to be higher. This is advantageous. Another advantage of the process of encapsulating the carbon is that the flatness of the thermal management board can be maintained at typically plus or minus 5 μm across a plate that is 100 mm by 100 mm, provided the original material is suitably flat.

Using the encapsulation process described above it is possible to encapsulate, for example, a graphite plate 10 having a thickness of 200 μm in a polyimide or epoxy resin or acrylic or polyurethane or polyester layer having a thickness in the range of 8–30 μm, preferably 15 μm. This results in a thermal management board 13 having a total thickness in the range of 208–230 μm. Encapsulating the plate in this amount of material results in a board having a tensile strength that is significantly higher than that of the original carbon plate, thereby making the board sufficiently strong for it to be handled easily. This is done with a negligible increase in volume and loss of thermal conductivity. This is unexpected and advantageous.

Figure 4:
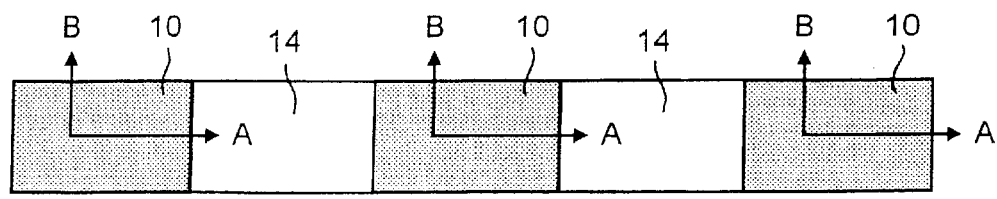
FIG. 4 is a cross-section through a carbon plate that has been drilled with holes.
Figure 5:
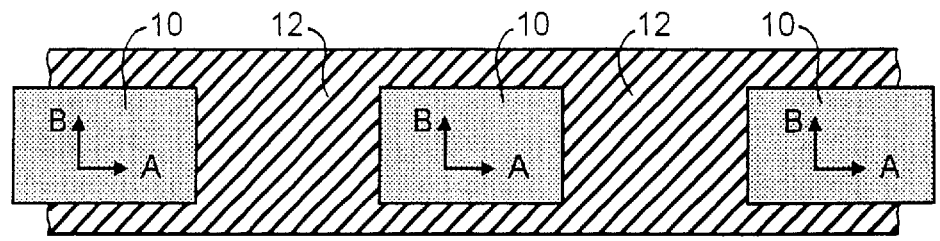
FIG. 5 is similar cross-section to that of FIG. 4 except that the plate has been coated with encapsulating material.

In many applications, thermal management devices are sandwiched between layers of printed circuit boards. Hence, it is advantageous to be able to allow direct electrical interconnection between opposing sides of the device. In order to achieve this in the present case, prior to encapsulation, a matrix of holes is formed in the graphite plate 10 by, for example, drilling. This is shown in FIG. 4. The holes 14 should each have a diameter that is greater than the desired final diameter. Typically, the diameter of the holes 14 formed at this stage would be at least 200 µm greater than the desired diameter. The holes 14 can of course be formed in any desired layout. Polyimide or epoxy resin or acrylic or polyurethane or polyester 12 or any other suitable polymer is then applied to the plate 10 in order to coat its surfaces and fill in the holes 14, as shown in FIG. 5. If desired, the holes could in fact be infilled with a mixture of the encapsulating material, for example polyimide, and glass spheres. This process can be carried out before the pure polyimide is used to encapsulate the surface of the plate. This improves the uriformity of the coating thickness across the surface of the plate, by preventing the possibility of thinning occurring around the edges of the initial holes. Once the plate is fully encapsulated, it is then processed as described above thereby to provide a rigid and highly thermally conducting board.

Figure 6:
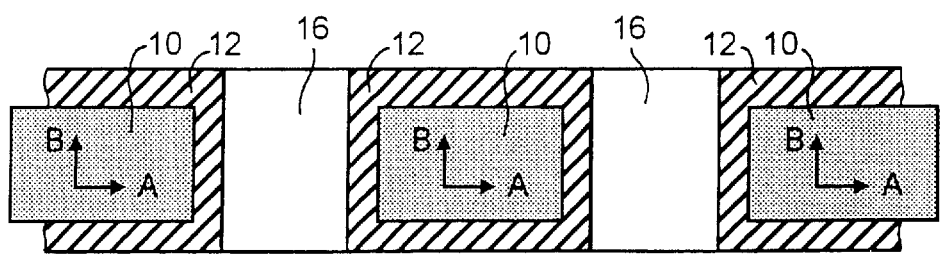
FIG. 6 is a cross-section similar to that of FIG. 5 except that holes are formed through the encapsulating material.
Figure 7:
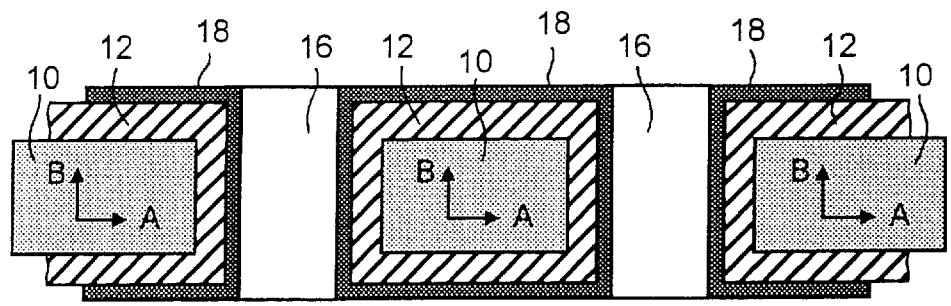
FIG. 7 is a cross-section similar to that of FIG. 6 in which the plate has been covered with metal.
Figure 8:
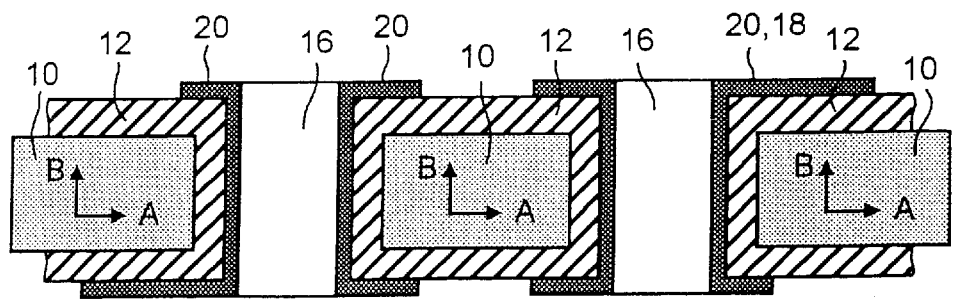
FIG. 8 is a cross-section similar to that of FIG. 7 in which interconnection structures have been etched on both sides of the plate.

In order to provide electrical connections through the board, the in-filled holes 14 are re-drilled to form holes 16 of a smaller diameter, typically 100 µm or greater, as shown in FIG. 6. In this way passages are formed through the board but the graphite 10 material remains encapsulated in the polyimide or resin or acrylic or polyurethane or polyester 12 or other suitable polymer and so electrically insulated. Metal 18, such as aluminium is then deposited on both sides of the board, as shown in FIG. 7, typically using thin film aluminium processing techniques. Interconnection structures 20 are subsequently etched using standard techniques on both sides of the board, as shown in FIG. 8. In this way, a board 22 is produced having metalised holes through an encapsulated carbon plate, the metal of the holes being entirely insulated from the carbon 10.

The encapsulated thermal management board 13,22 can be used as an interface to various assemblies. For example, it can be used for direct thermal management of ceramic substrates such as alumina, beryllia and aluminium nitride, or metal substrates such as beryllium. This is achieved by applying, for example, a thin layer of liquid epoxy resin to one surface of the ceramic substrate, heating the substrate to 125° C. to polymerize the resin, and then positioning the substrate on the carbon plate 10 or thermal management board 10,22. A high pressure, low vacuum pressing at 180° C. is then applied to produce a bubble-free interface with a thickness of only a few microns. An alternative process is to coat the ceramic or metal substrate with a thin layer of liquid epoxy glue (typically a few microns thick), position it onto the anisotropic carbon plate or the thermal management board and attach it by allowing the epoxy to polymerise under pressing and low vacuum at room temperature, in order to produce a bubble-free interface.

Figure 9:
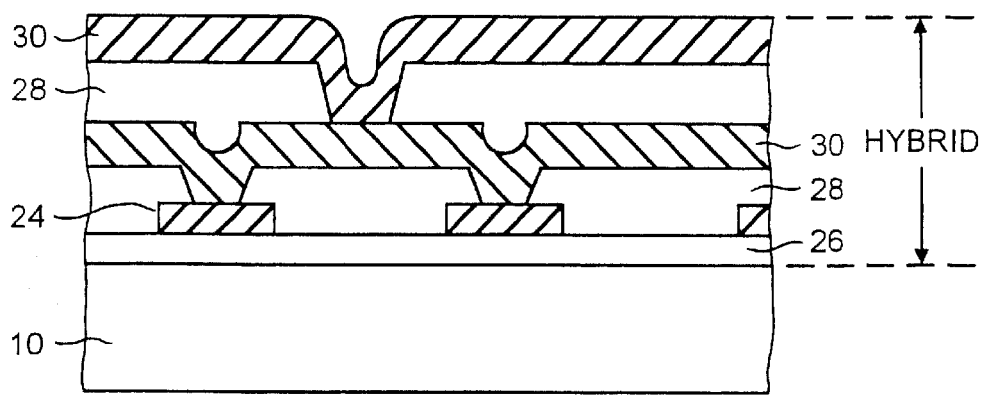
FIG. 9 is a cross section through a plate similar to that shown in FIG. 3 onto which a multi-layer electrical circuit has been directly fabricated.

The thermal management board 13,22 can also be used as a substrate for the custom design of thin film multi-layer circuits using alternating layers of vacuum deposited aluminium and polyimide. The aluminium 24 may be directly deposited onto the polyimide or resin or acrylic or polyurethane or polyester of the board 13,22 typically using thin film aluminium techniques so that layers having thicknesses of 5 µm can be deposited. FIG. 9 shows aluminium 24 deposited onto a layer of epoxy resin 26 which is in turn deposited on one surface of plate 10. Because the coated surface of the plate 10 is flat, the resolution of the lithography used to deposit the aluminium 24 is good. This means that small features can be readily defined. Polyimide 28 is then applied over the aluminium by spinning or screen-printing. Hence, the thickness of the polyimide layer 28 can be, for example, as little as 8 µm. Using standard fabrication techniques, holes are then defined through the polyimide 28 in appropriate places so that subsequent layers of metal 30 that fill these holes can provide electrical contact to the aluminium 24. Between the subsequent layers of metal 30 are, typically, layers of polyimide 28. Of course this processing could be done on opposing sides of the plate 10 thereby to provide a double sided electrical component with an intrinsic thermal management capability.

Figure 10:
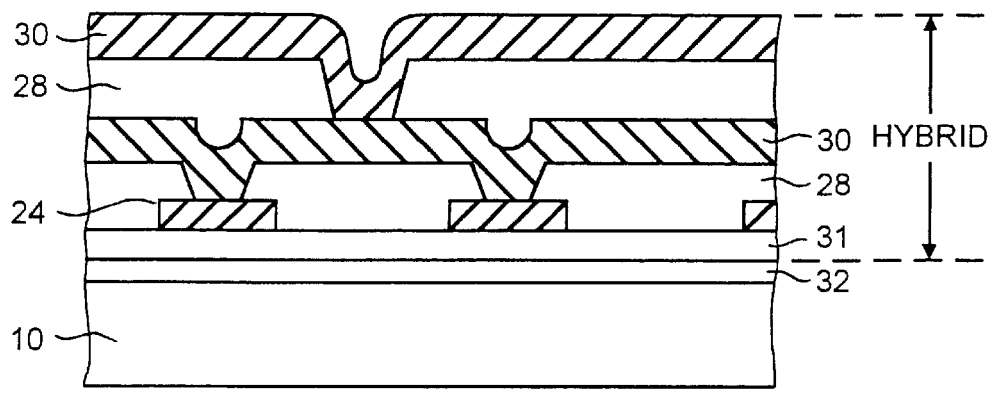
FIG. 10 is a cross section similar to that of FIG. 9. but in this case the multi-later electrical circuit has been fixed to a surface of the carbon plate using epoxy resin.
Figure 11:
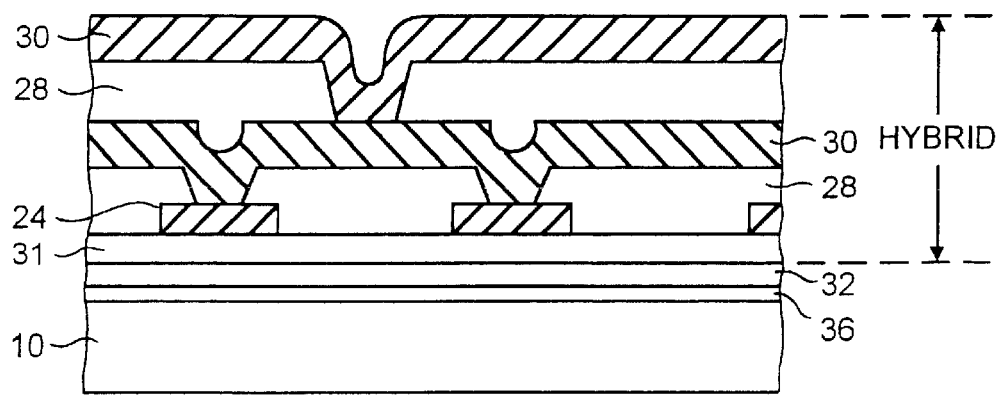
FIG. 11 is similar to FIG. 10, except that the multi-layer circuit is mounted using epoxy on a surface of a carbon plate that has been coated with polyimide.

The thin-film multi-layer circuits can also be fabricated on alternative substrates, for example aluminium, and subsequently separated chemically. These circuits or other custom-designed multi-layer circuits which may be fabricated on polyimide layers or epoxy resin based layers 31 can also be interfaced to the initial anisotropic carbon plate by applying, for example, a thin layer of liquid epoxy glue 32 (typically a few microns thick) to the plate 10, placing the multi-layer circuit on that surface and allowing the epoxy to polymerise under pressing and low vacuum at room temperature, in order to produce a bubble-free interface. A device that has been fabricated by applying epoxy resin 32 to a carbon plate 10 is shown in FIG. 10. In this case the epoxy resin 32 acts both as a fixing agent to secure the multi-layer circuit to the carbon plate 10 and additionally as the material for encapsulating the carbon plate. In contrast, FIG. 11 shows a multi-layer circuit that is interfaced using epoxy resin 32 with a surface of a carbon plate 10 that has been coated with, for example, polyimide 36.

In hybrid structures fabricated using any of the processes described above, changes in the temperature can cause variations in the lengths of the structural component layers. The changes in length for the encapsulated board are different from those of the materials that form the attached multi-layer hybrid structure. This affect degrades the overall surface flatness, which can be a disadvantage in some applications. It has been found, however, that optimum flatness can be maintained, over a range of temperatures, typically 100 C, by depositing a compensatory layer of encapsulating material on the opposite side of the thermal management board to that which carries the hybrid. This compensatory layer should be of the same material and substantially the same thickness as the layers of material that form the multi-layer hybrid structure. In this way, each side of the board has approximately the same co-efficient of thermal expansion and the overall flatness of the board does not vary substantially.

Figure 12:
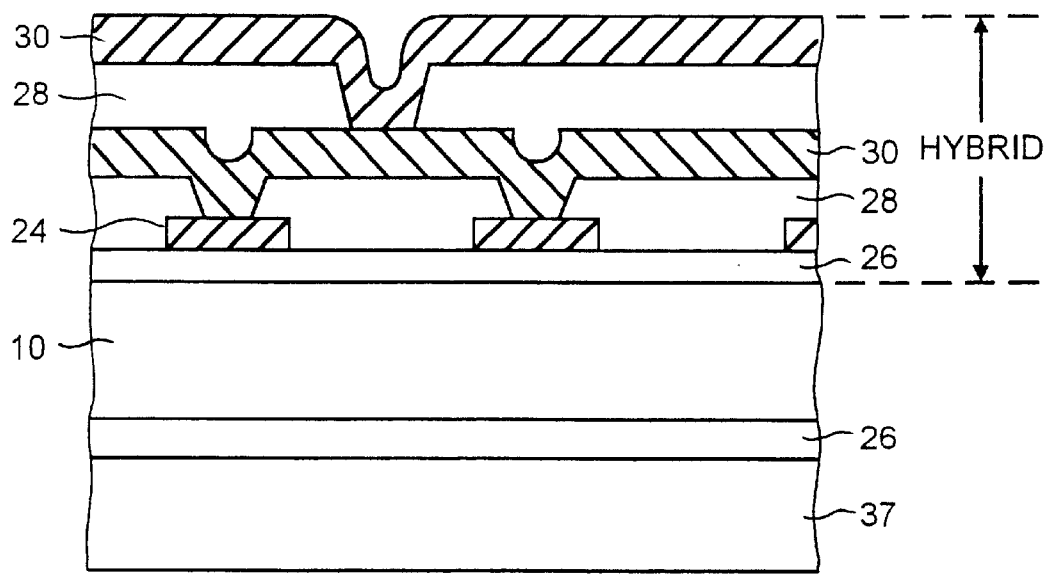
FIG. 12 is a cross section through a structure that is similar to that of FIG. 9, except a compensatory layer is included on the back-side of the structure.
Figure 13:
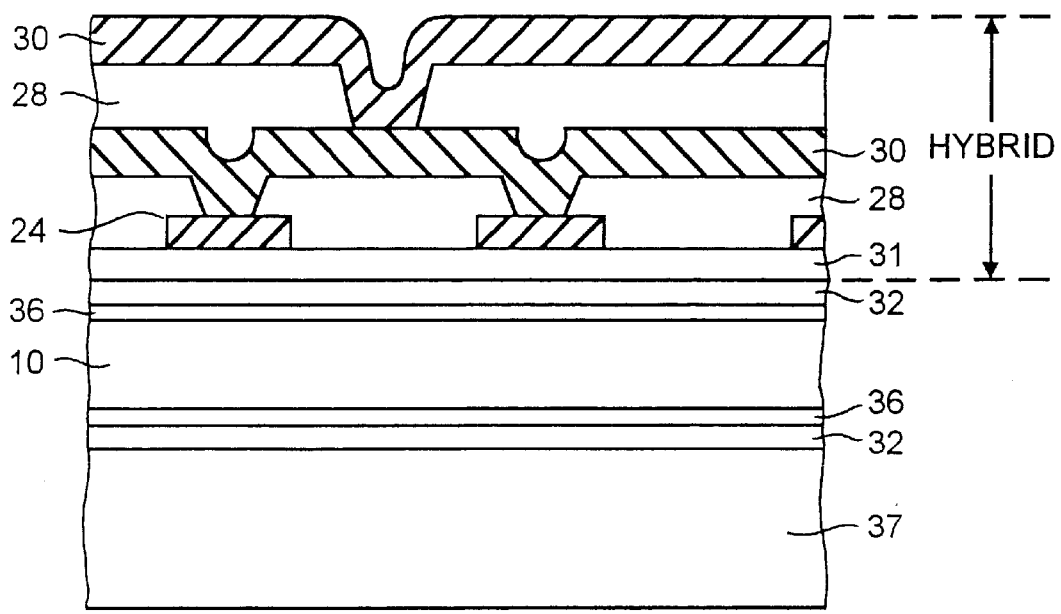
FIG. 13 is a cross section through a structure that is similar to that of FIG. 11, except a compensatory layer is included on the back-side.

The compensatory layer can be mounted either by building up additional layers of encapsulating material on the board until the desired thickness is achieved or alternatively by gluing a cast of the material onto the surface of the board in a similar manner as previously described. As an example, FIG. 12 shows the structure of FIG. 9 onto which has been deposited a compensatory layer of polyimide 37 that has a thickness that is roughly the same as the combined thickness of layers 28 of FIG. 10, assuming in this case that the thickness of the hybrid structure is dominated by the layers of polyimide 28. As a further example, FIG. 13 shows the structure of FIG. 11, onto which has been glued a compensatory layer of polyimide 37, which has a thickness that is roughly the same as the combined thickness of the layers 28 and 31 of the structure of FIG. 11. Again this assumes that the thickness of the hybrid structure is dominated by the layers 28 and 31.

To provide additional rigidity to the composite structure and/or to protect the edges against impact or delamination, the anisotropic carbon plate can be inserted within a surrounding thin frame, which is preferably made of material having the same co-efficient of thermal expansion as the structure, for example, carbon fibre. In this way, a single flat surface is provided that can be coated and attached to the multi-layer circuit in the room temperature process described above.

Figure 14:
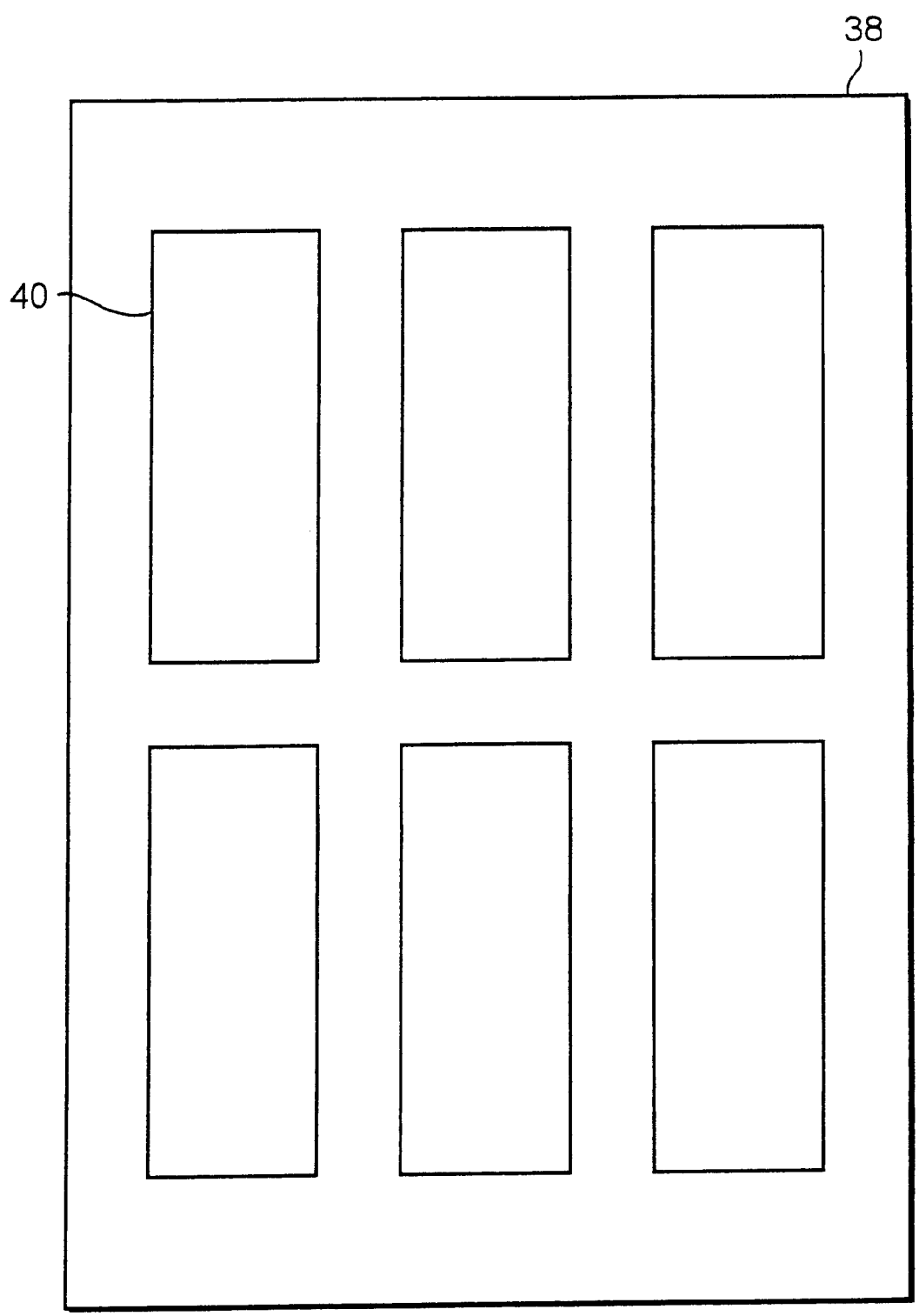
FIG. 14 is a top view of a large carbon plate, on which is a plurality processed sites.

Hybrid devices that include, for example, multi-layer circuits and a thermal management board can be made in various ways. In one technique, a plurality of such devices is fabricated from one large carbon plate. FIG. 14 shows such a plate 38 on which are six processing sites 40. Each processing site is coated with, for example, polyimide, onto which the multi-layer circuits can be either directly deposited or fixed using epoxy glue. Once the processing at each site is completed, the plate 38 is cut up to form six discrete devices. The uncoated sides of the carbon plate are then processed as previously described to ensure complete encapsulation of the carbon and formation of a thermal management board. An advantage of this particular technique is that problems associated with the edges of the carbon plate 38 are avoided.

These procedures allow the thermal conductivity and low mass property of the initial thermal management structure to be preserved after interfacing with the custom-made multi-layer circuits.

As mentioned previously in some known applications where relatively high thermal conductivity is required, beryllia substrates with a layer of dielectric formed thereon have been used, and gold contacts are deposited onto the dielectric. However, the hybrid electronic device that uses the thermal management device in which the present invention is embodied provides significantly higher thermal conductivity with a significant reduction in cost. Furthermore, because the materials involved are not hazardous, the fabrication of such devices is less problematic.

The process as described above allows the fabrication of electronic assemblies with high component densities constructed on a high thermal conductivity, low mass, graphite plate or core having the possibility of customised electrical interconnections between its opposing faces. This is achieved without the use of hazardous materials.

The thermal management board that uses thermalised pyrolytic graphite has an optimal in-plane thermal conductivity typically of 1550–1850 mK at room temperature, whilst at the same time having a low mass and easy to handle structure. In addition, the substrates can be readily used as interfaces between other circuits. Furthermore, any geometry of the carbon can be used prior to encapsulation so that the thermal management device can be custom made for each particular application. This is advantageous because it means that the application of the process is not significantly limited.

In the use of thermal management structures for cooling electrical systems, thermal grease is often used as an interface. It is envisaged that a thermal management device in which the invention is embodied could be used in place of the grease, it being appreciated that the device used in such an application should be relatively thin.

The skilled person will appreciate that variations of the disclosed arrangements are possible without departing from the invention. Accordingly, the above description of several embodiments is made by way of example and not for the purposes of limitation. In addition, it will be clear to the skilled person that minor modifications can be made without significant changes to the concepts described above.

What is claimed is:

1. A thermal management device comprising anisotropic carbon encapsulated in an encapsulating material that is applied directly to the anisotropic carbon, wherein the anisotropic carbon is pyrolytic graphite or thermalized pyrolytic graphite.

2. A thermal management device as claimed in claim 1, wherein the encapsulating material is polyimide or epoxy resin or acrylic or polyurethane or polyester.

3. A thermal management device as claimed in claim 1, wherein the anisotropic carbon has mosaic or full ordering.

4. A thermal management device as claimed in claim 1, wherein the thermalized pyrolytic graphite has an in plane thermal conductivity in the range of 1550–1850 W/mK at room temperature.

5. A thermal management device as claimed in claim 4, wherein the thermalized pyrolytic graphite has a low value of tensile strength in the orthogonal direction.

6. A thermal management device as claimed in claim 1, wherein the pyrolytic graphite is in an "as deposited" or partially ordered form.

7. A thermal management device as claimed in claim 6, wherein the conductivity of the pyrolytic graphite is in the range of 300–420 W/mK in one plane.

8. A thermal management device as claimed in claim 1, wherein the tensile strength of the anisotropic carbon is 1.5 Ksi in the orthogonal plane.

9. A thermal management device as claimed in claim 1, wherein the anisotropic carbon is a plate.

10. A thermal management device as claimed in claim 9, wherein the carbon plate has a thickness in the range 100–500 µm.

11. A thermal management device as claimed in claim 1 wherein the material encapsulating the carbon has a low thermal expansion coefficient and high degradation temperature.

12. A thermal management device as claimed in claim 1, wherein the encapsulating material has a thickness in the range from 8 microns to 30 microns.

13. A thermal management device as claimed in claim 1, wherein multiple layers of encapsulating material are deposited on the carbon in order to build up a desired thickness.

14. A thermal management device as claimed in claim 1, wherein a matrix of fine holes is formed through the carbon.

15. A thermal management device as claimed in claim 14, wherein the holes are filled during encapsulation of the plate.

16. An electrical system comprising a thermal management device that includes anisotropic carbon encapsulated in an encapsulating material that is applied directly to the anisotropic carbon, wherein the anisotropic carbon is pyrolytic graphite or thermalized pyrolytic graphite, and electrical contacts and/or devices are provided on the surface of the thermal management device.

17. An electrical system as claimed in claim 16, wherein the electrical contacts and/or devices are deposited directly on the surface of the thermal management device or are glued thereto.

18. An electrical system as claimed in claim 16, wherein the devices are encapsulated in polyimide or epoxy resin or acrylic or polyurethane or polyester.

19. An electrical system as claimed in claim 16, wherein a plurality of layers of electrical components are provided.

20. An electrical system as claimed in claim 19, wherein each layer of electrical components is spaced apart by layers of encapsulating material.

21. An electrical system as claimed in claim 16, wherein the electrical contacts are made of thin film metal.

22. A method of fabricating a thermal management device comprising:
- cleaning a surface of pyrolytic graphite or thermalized pyrolytic graphite;
- applying a coat of encapsulating material directly to the cleaned surface; and
- repeating the step of applying until the graphite is encapsulated.

23. A method as claimed in claim 22, wherein the encapsulating material is one of polyimide or epoxy resin or acrylic or polyurethane or polyester.

24. A method as claimed in claim 23 that further involves curing the encapsulating material.

25. A method as claimed in claim 22, wherein the step of applying involves brushing or rolling or dipping or spraying or spinning or stamping or screen-printing.

26. A method as claimed in claim 25, wherein for polyimide, which consists of a single-component, the step of applying the coat involves brushing the polyimide onto the surface or applying it using a roller.

27. A method as claimed in claim 23, wherein for solid phase application a cast is used.

28. A method as claimed in claim 27, wherein the carbon and cast are pressed together within a vacuum and at high temperature.

29. A method as claimed in claim 23, wherein multiple layers of encapsulating material are applied until a desired thickness is reached.

30. A method as claimed in claim 22, wherein the step of cleaning involves using pumice powder under water to remove loose materials, followed by drying.

31. A method as claimed in claim 22, wherein the step of drying involves drying the carbon by baking the carbon surface to remove moisture.

32. A method as claimed in claims 31, wherein the step of drying involves baking the carbon at 100 C for one hour.

33. A method as claimed in claim 22, wherein the step of cleaning involves degreasing the surface of the pyrolytic graphite or thermalized pyrolytic graphite.

34. A method as claimed in claim 24, wherein when polyimide is used, the step of curing involves heating the carbon to substantially 150 C and subsequently temperature cycling the carbon to 150 C for 30 minutes, 250 C for 30 minutes and finally 300 C for 30 minutes.

35. A method as claimed in claim 22, further comprising drilling the carbon with at least one hole prior to application of the encapsulating material.

36. A method as claimed in claim 35, wherein the at least one hole is infilled with encapsulating material.

37. A method as claimed in claim 35, wherein the holes are infilled with encapsulating material that is mixed with glass fiber spheres.

38. A method as claimed in claim 36, wherein the infilled holes are drilled thereby to provide through passages that are electrically isolated from the carbon.

39. A method as claimed in claim 38, wherein a layer of a conducting material is applied to the at least one through passage to produce electrical connections, thereby to enable electrical connections through the carbon.

40. A method as claimed in claim 39, wherein the conducting material is a metal.

41. A method as claimed in claim 35, comprising coating edges that define the at least one hole with the encapsulating material in such a way as to maintain a passage through the carbon.

42. A method as claimed in claim 22, wherein the pyrolytic graphite or thermalized pyrolytic graphite is a plate, the method further involving forming a matrix of fine holes through the plate.

43. A method of fabricating an electrical component comprising the method as defined in claim 22, additionally comprising the steps of forming electrical contacts on at least one surface of the carbon and/or depositing electrical devices thereon.

44. A method as claimed in claim 43, wherein the step of depositing involves fabricating the devices directly on the surface or forming the devices or a thin film multi-layer circuit containing the devices separately from the carbon surface and fixing them to that surface.

45. A method as claimed in claim 44, wherein the step of fixing involves applying epoxy glue to the devices or the circuit or the carbon surface and pressing the devices or circuit and the surface together at room temperature and at low vacuum.

46. A method as claimed in claim 43, wherein the electrical contacts are applied using thin film processing techniques.

47. A thermal management device as claimed in claim 9, wherein the carbon plate has a thickness in the range 200–250 $\mu$m.

48. A thermal management device as claimed in claim 9, wherein the carbon plate has a thickness in the range 250–300 $\mu$m.

49. A thermal management device as claimed in claim 9, wherein the carbon plate has a thickness in the range 300–350 $\mu$m.

50. A thermal management device as claimed in claim 9, wherein the carbon plate has a thickness in the range 350–400 $\mu$m.

51. A thermal management device as claimed in claim 9, wherein the carbon plate has a thickness in the range 400–450 $\mu$m.

52. A thermal management device as claimed in claim 9, wherein the carbon plate has a thickness in the range 450–500 $\mu$m.

53. A thermal management device as claimed in claim 14, wherein each hole has a diameter of 200 $\mu$m.

54. An electrical system as claimed in claim 17, wherein the electrical contacts and/or devices are glued to the surface of the thermal management device using a thin layer of liquid glue.

55. An electrical system as claimed in claim 20, wherein the encapsulating material is polyimide.

56. An electrical system as claimed in claim 21, wherein the thin film metal is aluminium.

57. A method as claimed in claim 33, wherein the step of cleaning involves degreasing the surface of the pyrolytic graphite or thermalized pyrolytic graphite by rinsing it with acetone.

58. A method as claimed in claim 34, wherein the step of curing involves heating the carbon to substantially 150 C for one hour.

59. A method as claimed in claim 36, wherein the holes are infilled with encapsulating material that is mixed glass fiber spheres, each sphere having a diameter of 30 $\mu$m.

60. A method as claimed in claim 40, wherein the conducting material is thin film aluminum.

61. A method as claimed in claim 46, wherein the electrical contacts are applied using thin film processing techniques using aluminum.

62. A thermal management device as claimed in claim 1, wherein the encapsulating material has a thickness of 15 microns.

63. A thermal management device as claimed in claim 1, wherein the encapsulating material has a thickness in the range from two microns to ninety microns.

64. A thermal management device as claimed in claim 1, wherein the anisotropic carbon is completely encapsulated in the encapsulating material.

65. A thermal management device as claimed in claim 64, wherein the encapsulating material is a single encapsulating material.

66. A thermal management device as claimed in claim 1, wherein the encapsulating material is applied directly to all surfaces and edges of the anisotropic carbon.

67. An electrical system as claimed in claim 16, wherein the anisotropic carbon is completely encapsulated in the encapsulating material.

68. An electrical system as claimed in claim 16, wherein the thermal management device is adapted to provide direct electrical interconnection between opposing sides of the thermal management device.

69. A method as claimed in claim 22, wherein the applying step is repeated until the graphite is completely encapsulated.

* * * * *